United States Patent
Nanbu et al.

(10) Patent No.: US 10,556,292 B2
(45) Date of Patent: Feb. 11, 2020

(54) METHOD FOR BONDING ALUMINUM-BASED METALS

(75) Inventors: Toshikazu Nanbu, Machida (JP); Kenji Miyamoto, Yokosuka (JP); Masayuki Inoue, Yokohama (JP); Chika Yamamoto, Tokyo (JP); Yoshitaka Uehara, Yokohama (JP); Akio Hirose, Ibaraki (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 780 days.

(21) Appl. No.: 13/819,390

(22) PCT Filed: Aug. 30, 2011

(86) PCT No.: PCT/JP2011/069617
§ 371 (c)(1),
(2), (4) Date: Mar. 13, 2013

(87) PCT Pub. No.: WO2012/029789
PCT Pub. Date: Mar. 8, 2012

(65) Prior Publication Data
US 2014/0030634 A1    Jan. 30, 2014

(30) Foreign Application Priority Data

Aug. 31, 2010   (JP) ................. 2010-193519

(51) Int. Cl.
*B23K 20/00* (2006.01)
*B23K 35/28* (2006.01)
(Continued)

(52) U.S. Cl.
CPC .............. *B23K 20/00* (2013.01); *B23K 20/02* (2013.01); *B23K 20/16* (2013.01);
(Continued)

(58) Field of Classification Search
None
See application file for complete search history.

(56) References Cited

U.S. PATENT DOCUMENTS 3,121,785 A * 2/1964 Terrill ................ B23K 20/2336
219/118
3,811,177 A * 5/1974 Schoer et al. ................ 228/219
(Continued)

FOREIGN PATENT DOCUMENTS

CN      101530947 A       9/2009
EP      1882542 A1 *      1/2008
(Continued)

OTHER PUBLICATIONS

Kang et al., "Alloy design of Zn—Al—Cu solder for ultra high temperatures", Journal of Alloys and Compounds 467 (2009) 246-250; 5 pages total.*

(Continued)

*Primary Examiner* — Ula C Ruddock
*Assistant Examiner* — Anna Korovina
(74) *Attorney, Agent, or Firm* — Young Basile Hanlon & MacFarlane, P.C.

(57) ABSTRACT

An inexpensive bonding method is provided to bond materials constituted of an aluminum-based metal to each other at a low temperature and a low pressure while inhibiting deformation, without requiring the use of a flux and minimizing the influence on the base materials and the periphery. Also provided are various bonded parts obtained by the bonding method. An insert material comprising Zn as an element that undergoes a eutectic reaction with Al is interposed between two materials constituted of an aluminum-based metal. The two materials are heated, while being pressed against each other, to a temperature at which the eutectic reaction takes place, thereby generating, at the bonding interface between the two materials, a melt due to (Continued)

the eutectic reaction with some of the Al contained in the base materials and discharging the Al oxide films from the bonding interface together with the melt. Thus, the two materials are bonded.

12 Claims, 4 Drawing Sheets

(51) Int. Cl.
    *B23K 35/00*     (2006.01)
    *B23K 20/16*     (2006.01)
    *B23K 20/233*     (2006.01)
    *B23K 20/02*     (2006.01)
    *B23K 35/26*     (2006.01)
    *B23K 103/10*     (2006.01)

(52) U.S. Cl.
    CPC ........ *B23K 20/2336* (2013.01); *B23K 35/002* (2013.01); *B23K 35/26* (2013.01); *B23K 35/282* (2013.01); *B23K 2103/10* (2018.08); *H01L 2224/32225* (2013.01); *H01L 2224/48091* (2013.01); *H01L 2224/48227* (2013.01); *H01L 2224/73265* (2013.01); *Y10T 428/1275* (2015.01); *Y10T 428/12708* (2015.01); *Y10T 428/12729* (2015.01); *Y10T 428/12764* (2015.01)

(56) References Cited

U.S. PATENT DOCUMENTS

| | | | | |
|---|---|---|---|---|
| 4,046,305 | A | * | 9/1977 | Brown ............... B23K 20/2336 228/135 |
| 4,331,286 | A | * | 5/1982 | Miyazaki ............ B23K 20/233 228/194 |
| 4,615,952 | A | * | 10/1986 | Knoll ..................... B21C 29/006 165/133 |
| 4,905,887 | A | * | 3/1990 | Schoer ................. B23K 35/282 228/217 |
| 4,979,664 | A | * | 12/1990 | Lyons et al. ............. 228/180.21 |
| 5,464,146 | A | * | 11/1995 | Zaluzec et al. ................ 228/208 |
| 5,802,716 | A | * | 9/1998 | Nishimura et al. ........ 29/888.06 |
| 2003/0155409 | A1 | * | 8/2003 | Dockus et al. ................ 228/245 |
| 2006/0027625 | A1 | * | 2/2006 | Dockus ................ B23K 35/282 228/56.3 |
| 2006/0150387 | A1 | * | 7/2006 | Kobayashi ........... B23K 11/166 29/458 |
| 2006/0243778 | A1 | * | 11/2006 | Yamaguchi et al. .......... 228/101 |
| 2007/0221631 | A1 | * | 9/2007 | Ruokolainen .......... B23K 9/173 219/121.11 |
| 2008/0026247 | A1 | * | 1/2008 | Nakagawa ........... B23K 11/115 428/649 |

FOREIGN PATENT DOCUMENTS

| | | | |
|---|---|---|---|
| JP | 55-057388 A | | 4/1980 |
| JP | 60-024286 A | | 2/1985 |
| JP | 9-250391 A | | 9/1997 |
| JP | 11-172354 A | | 6/1999 |
| JP | 11207487 A | * | 8/1999 |
| JP | 2000-301355 A | | 10/2000 |
| JP | 2004-014599 A | | 1/2004 |
| JP | 2006239745 A | | 9/2006 |
| JP | 2008-264822 A | | 11/2008 |
| JP | 2009-009731 A | | 1/2009 |
| RU | 2262153 C2 | | 4/2005 |
| WO | WO-9962667 A1 | * | 12/1999 ............. B23K 20/16 |
| WO | 03075337 A1 | | 9/2003 |

OTHER PUBLICATIONS

Ooucchi et al. (JPS 55-057388) machine translation (Year: 1980).*
Mashita (JP 2000-301355) machine translation (Year: 2000).*
Shimizu JPH 11207487 Machine Translation (Year: 1999).*
English Translation of the May 6, 2014 Official Action from corresponding Russian Application No. 2013110495/02 (015562) filed Aug. 30, 2011.
S.V. Lashko et al., Brazing/Soldering of Metals, Moscow, 'Mashinostroenie', 1988, pp. 52-54, 62-63, and pp. 265-267, table 37.

* cited by examiner

METHOD FOR BONDING ALUMINUM-BASED METALS

TECHNICAL FIELD

The present invention relates to a joining method of aluminum-based metal materials with a strong oxide film present on the surface, and in particular relates to a low-cost joining method capable of joining the metals in air at low temperature and minimizing the thermal influence on the base materials and on the periphery or surrounding, and further relates to joint or bonded parts obtained by such a joining method.

In the present invention, the aluminum-based metal refers to a pure aluminum or an aluminum alloy containing at least Al.

BACKGROUND

On the surface of a material made of pure aluminum or an aluminum alloy (collectively hereinafter referred to as "aluminum-based metal"), a dense and strong oxide film is formed, and because its presence poses an obstacle, joining of these aluminum-based metals is difficult in metallurgical processes.

For example, in Japanese Patent Publication of Application, No. JP 3-66072, it is described that, when joining the aluminum materials or joining an aluminum and alumina, by interposing an insert material containing an element causing the eutectic reaction with the base material between the surfaces to be bonded, after being contacted in an oxygen atmosphere and heated to a temperature range in which the eutectic reaction may occur, a phase of melt due to the eutectic reaction and an oxide film phase due to reaction between component in the melt phase and oxygen present in the gap of contact surface between the base component and contact surface occur. Therefore, the oxide film on the surface of the base material is destroyed, and, along with the oxide by the reaction of the oxygen and the melt component, is mixed in the melt phase.

Further, a joining technique for aluminum-based metal, brazing using a brazing material made of Al—Si alloy, is also known. In this case, however, by using the flux of fluoride, for example, oxide film will be removed.

However, in the above mentioned process, the insert material of copper, silver, silicon, aluminum-silver hypereutectic alloy, aluminum-copper hypereutectic alloy, aluminum-silicon hypereutectic alloy is used. Therefore, since the eutectic temperature between these insert materials and aluminum exceeds 500° C. (in the Al—Cu system, 548° C., in the Al—Si system, 577° C., respectively, for example), the junction temperature is high, and especially with heat treatment alloy like 6000 system, even exceeds a solution treatment temperature, the problem arises that the base material is softened and strength is thus lowered. Further, since the joining is performed in an oxygen atmosphere, a special chamber is required with a problem in that the equipment cost increases.

BRIEF SUMMARY

The present invention has been made, in view of the above problems in the joining of the aluminum-based metal material, with aims to provide a method of joining at low cost in the atmosphere without using flux of materials whose thickness is even less than 1 mm at low temperature, low pressure and low distortion while minimizing the impact on the base material and the surrounding. In addition, a further object of the present invention is to provide a joining various components to which the above-described joining method is applied.

To achieve the above object, as a result of intensive studies, the present inventors have found that the above problem can be solved and have thus completed the present invention by interposing an insert material containing zinc as an element for causing a eutectic reaction to occur with base aluminum between materials to be joined.

Specifically, the present invention has been made based on the findings described above. In the joining method according to the present invention, an insert material is interposed between both materials of aluminum-based metal, which contains a Zn (zinc) element capable of causing eutectic reaction. While with both materials are being pressed against each other, heating to the temperature that results in eutectic reaction is performed to produce the melt by way of eutectic reaction with Al in the base material at the joint interface of both materials, and both materials are bonded by discharging from the joint interface of both materials the Al oxide film along with the melt.

Further, the parts according to the present invention are characterized by the above mentioned production method in which both materials made of aluminum-based metal are bonded directly or via mixture of component derived from the insert material.

According to the present invention, because between two aluminum-based metal materials, an insert material is interposed containing Zn, at least, due to pressure and heating operations, a eutectic melt of low melting temperature takes place between base materials Al, and without relying on use of flux in air, joining is available at low temperature, low heat introduction, low distortion, and low cost. Therefore, it is possible to prevent deformation of the members to be joined and the reduction in strength with further minimizing thermal effects on surrounding members.

BRIEF DESCRIPTION OF THE DRAWINGS

The description herein makes reference to the accompanying drawings wherein like reference numerals refer to like parts throughout the several views, and wherein.

DETAILED DESCRIPTION

Now, description is made in details and with specifics of the joining method of aluminum-based metals according to the present invention with reference to the bonded structure obtained by the method. It should be noted that, unless otherwise specified, "%" is intended to mean the percentage by weight herein.

As described above, when joining two materials made of aluminum-based metal, in the method for joining aluminum-based metals according to the present invention is, first an insert material is interposed between both materials including Zn as an element for producing eutectic reaction with Al.

Then, when joining, both materials are pressurized relatively against each other and heated to a temperature of eutectic reaction, and thus a melt is produced at the joint interface of both materials due to eutectic reaction between Al in the base material and the at least Zn contained in the insert material. Subsequently, the oxide film on the surface of base material will be discharged with the resulting melt for joining the both materials.

At this time, compared to the eutectic temperature or Cu (copper), Si (silicon), Ag (silver) and the like, the eutectic temperature of alloy containing Zn and Al is significantly lower (for Al—Zn base, 382° C., for Al—Zn—Mg, 330° C.), thus both materials may be bonded together by removing the joining disruptive oxide film from the bonded surfaces at low temperatures without causing deformation or softening of the base material.

The melt due to the eutectic reaction occurs when the composition of interdiffusion region produced by interdiffusion among a plurality of metals reaches eutectic composition, and when the eutectic holding temperature is equal to or greater than the eutectic temperature. The liquid phase is formed by the eutectic reaction. For example, in the case of Al—Zn alloy, the melting point of Al is 933K (660° C.), while melting point of Zn is 692.5K (419.5° C.), respectively, and the eutectic metal of these materials melts at a temperature lower than the respective melting points, 655K (382° C.).

Therefore, when both metals are brought into contact with clean surfaces of both metals, and kept on heating above 655K, a reaction (eutectic reaction) takes plate with Al-95% Zn of eutectic composition, but the eutectic reaction phenomenon is constant change regardless of the alloy components and changes in the composition of the insert member or material only controls to increase or decrease of the amount of eutectic reaction.

On the other hand, although on the surface of aluminum-based metal material, a solid oxide film is present, this will be physically destroyed by plastic deformation by the pressure during the process of joining an aluminum material. Specifically, since by rubbing between the microscopic convex portions in the surfaces of the material under pressure between base Al and the insert material, due to a local destruction of portion of the oxide film, some eutectic melting occurs from the portion of contact between base material Al and insert material over the interface between Al and insert material component. Thus, due to generation of liquid phase, the oxide film in the vicinity is crushed and broken down, and eutectic melting will be promoted to spread over the entire surface so that joining of both materials is achieved.

Because the eutectic composition is achieved spontaneously by interdiffusion, control of the composition is not required. The essential condition is that between the base metal Al and insert material metal, eutectic reaction of the low melting point is generated.

FIGS. 1A to 1E are a schematic diagram showing a joining process between the aluminum-based metal material according to method of the present invention.

Figure 1A:
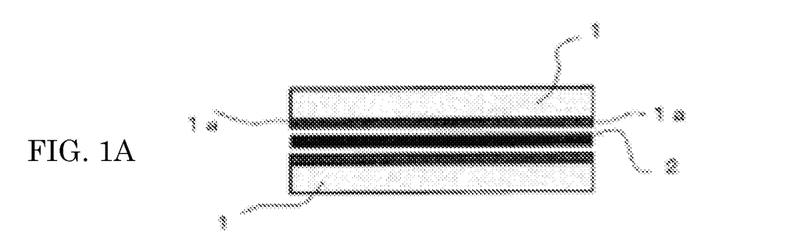
FIGS. 1A-1E together are a diagram schematically showing a process step of joining by the joining method of the present invention.

First, as shown in FIG. 1A, between materials 1, 1 made of aluminum-based metal, such as aluminum alloy, for example, an insert material 2 containing at least Zn, constituted of zinc foil, for example, is sandwiched and superimposed.

Note that an oxide film $1a$, $1a$ mainly composed of $Al_2O_3$ is generated on the surface of both materials 1, 1.

Figure 1B:
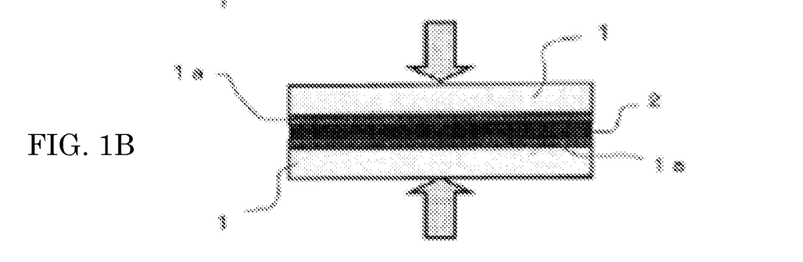
Figure 1C:
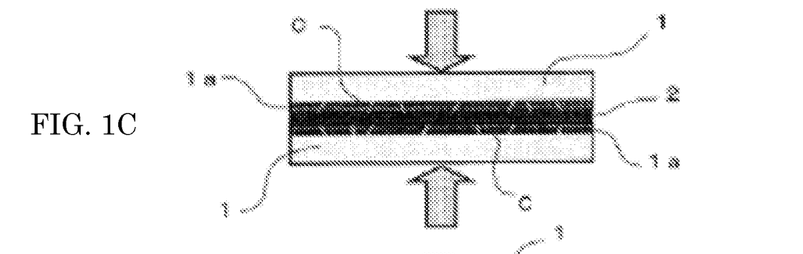
Figure 1D:
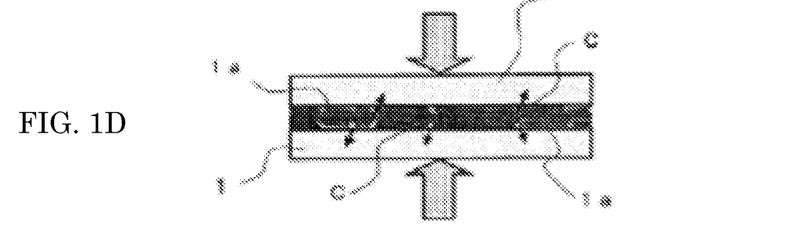

Then, as shown in FIG. 1B, both materials 1, 1 are pressurized and adhered to each other via insert material 2, heating will be initiated under pressure. Subsequently, deformation due to pressure occurs in both materials 1, 1, and, as shown in FIG. 1C, cracks C generate in the oxide film $1a$ on the plate surface. In this state, when reaching the eutectic temperature range, first AL in the oxide film $1a$ and Zn in insert metal 2 causes eutectic reaction to generate eutectic melting phase. Then, as shown in FIG. 1D, this liquid phase intrudes into the base material through cracks C thereby expanding eutectic melting area so that fragments of destroyed oxide film $1a$ will be dispersed in the liquid phase.

Figure 1E:
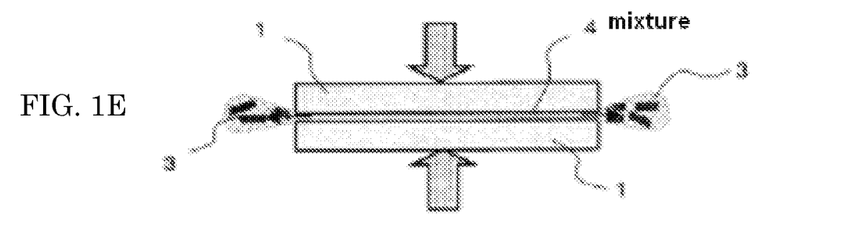

Due to subsequent pressurization, as shown in FIG. 1E, excess eutectic melt is discharged or pushed out from the joint or bonded interface. Therefore, both materials 1, 1 are joined together through a layer of mixture derived from insert material, consisting of mixture 4 including Zn or Zn—Al alloy in this example. As the case may be, depending on joining conditions, both materials 1, 1 are directly joined, or are bonded with some areas of mixture layer 4 interposed and the other areas of direct joining. A diffusion of Zn may be observed in the vicinity of the joining surface of aluminum alloy materials 1, 1.

Further, the emissions or discharges 3 from the joint interface including eutectic melt and fragments of oxide coating film may be expelled from the joint or bonded surface, and removed the finished joint connection in the case of butt bond. On the other hand, in the case of overlapped or spot joint or bond, it will be extruded from the joint portion, thus forming the seal portion by remaining around the bonded or joint area thereby improving sealing of the joint.

Note that, in the above, it has been described to the effect that Al in the oxide film and the insert metal first cause a eutectic reaction. However, depending on the components of insert material, the melting point of those components, and rate of temperature increase, the presence or absence of the reaction with Al in the oxide film might not be confirmed. In other words, in these cases, it may be contemplated that, through cracks in the oxide film, the insert material in solid state or molten state is brought into contact with Al in the base material for causing eutectic reaction to occur.

Although the joining method of aluminum-based metals according to the present invention can be carried out in an inert gas atmosphere, no difficulties will be encountered, even at joining operations in the atmosphere. Of course, it may be carried out in a vacuum. This not only requires vacuum equipment, but may also cause damage on a gauge or gate valve, so that it may be advantageous to carry out in air in terms of cost.

With respect to pressure range used in the joining method according to the present invention, it is desirable to set a range between 5 MPa or more and 30 MPa or less. Specifically, when the pressure is less than 5 MPa, the melt of eutectic reaction or oxide film of aluminum from the joint interface may not be able to be sufficiently discharged. On the other hand, at the pressure of 30 MPa or more, the possibility of deformation of joined materials would not be excluded.

In the joining method according to the present invention, as mechanism for heating and maintaining the joint portion within the above described temperature range, a resistance heating, high-frequency heating and a combination of these may be applied.

In addition, regarding the joint temperature, if excessively high, the liquid phase is generated in excess because of dissolution of the base material. Too excessive liquid phase remain in the joint interface, and there is a tendency that the sufficient strength cannot be obtained. Specifically, the temperature range between eutectic temperature and up to +100° C. of eutectic temperature is preferable.

Regarding heating rate to the above explained joint temperature, when slow, then the surface may be oxidized accompanied by reduction in discharge property of the melt, thus leading to decrease in strength. Thus, a greater rate is more preferable. Especially, in the case of joining in the atmosphere, there is such a tendency in particular. Specifically, 3° C./second is preferable, 10° C./second is more preferable, and the rate of 25° C./second or more is even more preferable.

In a joining method for aluminum-based metals according to the present invention, the insert material described above should contain at least Zn. More specifically, such metal is preferable that contains Zn, Zn and Al, Zn and Mg, Zn and Mg, Zn, Mg and Al, further Zn, Cu, Al, and Zn, Ag and Al as main components. Note that the "main component" indicates that the content of the above described metals is 80% or more. More specifically, such metal (pure zinc or zinc containing alloy) containing Zn, Zn+Al, Zn+Mg+Al, Zn+Cu+Al, Zn+Ag+Al and the like by 80% or more are intended.

Note that, it is desirable that the melting point of insert material is 500° C. or less. When the melting point exceeds this temperature, the junction or joint temperature will be higher, and in the case of heat treatable aluminum alloy, this exceeds the solution treatment temperature, thus possibly causing softening and deformation of the material.

Regarding the shape of the above insert material and ways of its interposition between both the materials, by way of plating or powder deposition, either or both joint surfaces of the materials may be pre-coated, or sandwiched in the form of foil between both materials. In this case, because of high degree of freedom in choosing the composition and shape (thickness) and the like, it is desirable to use a foil-like or foil shaped insert material When using a foil shaped insert material, if the thickness t is too thick, the emission is reduced due to excessive liquid phase while, when too thin, sufficient removal of oxide film will not be ensured due to insufficient liquid phase. In addition, regarding the surface roughness Ra of the joint surface, when too large (too coarse), there is a tendency for the liquid phase no longer fills the space made by irregularities or concave/convex portions so that removal of oxide film will be difficult. Conversely, when too small, liquid phase becomes excessive with respect to the irregularities and prevent joint surfaces from contacting each other so that generation of cracks are difficult. Therefore, adjustment in accordance with surface roughness of joint surfaces may be necessary.

Specifically, it is preferable to set the rate of surface roughness Ra of both materials to the thickness t of insert material, Ra/t within a range of 0.00003 to 0.06. In this case, the range of Rt/t of 0.00005 to 0.05 is more preferable, and the range of 0.0001 to 0.05 is even more preferable.

Note that, in the case of plating and powder deposition coating method, it is desirable that the coating thickness can be enough to fill the surface roughness Ra of the joint surface.

Further, the ratio of the covered area of by insert material in relation to the entire area to be bonded, depending on the shape of the bonded member, is desirably to be 30% or more. When less than 30% of the joining area, it may not be possible to discharge the oxide film due to insufficient liquid phase by eutectic melting.

The joining or joining structure with the joining method of the aluminum-based metals according to the present invention, in other words, the structure of the parts joined by the joining method described above, as described above as the joining process, both materials made of aluminum-based metal are bonded directly or bonded via a mixture comprising components derived from the insert material. At this time, in the vicinity of the joining surface of both materials, the diffusion of Zn, i.e., a component of the insert member, is observed.

In addition, in the case of overlapped or spot joining or joint or seam joint, components composed of the oxide film extruded from the joint portions or emissions derived from the melt eutectic remain between both materials to form a seal portion around the periphery of the joint portion (at both sides of seam portion in seam-like junction).

Figure 2:
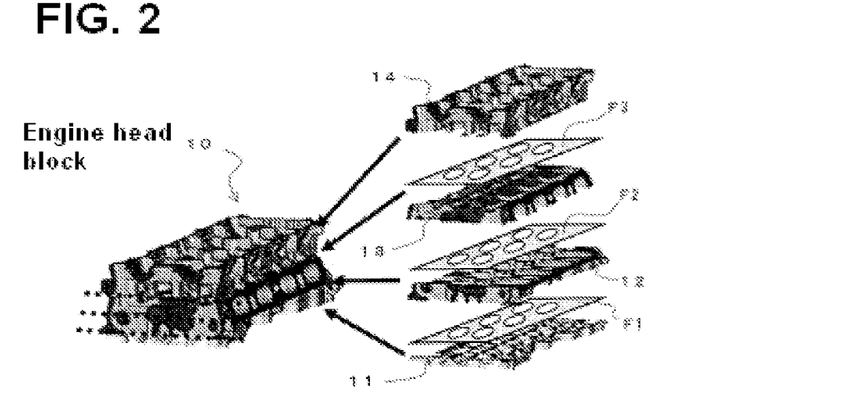
FIG. 2 is a schematic diagram showing the structure of an engine head block of division cast type as an example of parts joined by a joining method according to the present invention.

FIG. 2 is a schematic diagram showing the structure of split cast engine head block as an embodiment in the joining method described above according to the present invention. Engine head block 10 shown consists of four pieces 11 to 14 made of die casting aluminum alloy, such as Al—Si—Cu-Ma based alloy (AC4D), for example.

As shown in the figure, these four separate pieces 11, 12, 13 and 14 are superimposed on one another with insert material F1 to F3 of the thickness of 300 μm interposed between respective pieces. The insert materials F1 to F3 are made of pure zinc foil having circular holes formed at a position corresponding to each cylinder bore.

In addition, after being fixed in a pressurized state to each other by a predetermined jig, in a high-frequency induction heating furnace, the assembled pieces will be heated and held within a temperature range of between 382 and 482° C., such as at 450° C., at which a eutectic reaction of Al and Zn occurs, thus each piece will be joined and an engine head block 10 is completed.

At this time, the joint surface of respective separate pieces is preferably finished with surface roughness Ra of about 1.6 μm, for example, in order that the ratio of surface roughness to the thickness of insert material, 300 μm, to be within the range of 0.00003 to 0.06 (in this example, Ra/t=0.0053).

The engine head block 10 manufactured this way is superior in sealing property with less distortion. Also, when during casting, since the core is not required for forming the bore, the degree of freedom in design may be improved.

Figure 3:
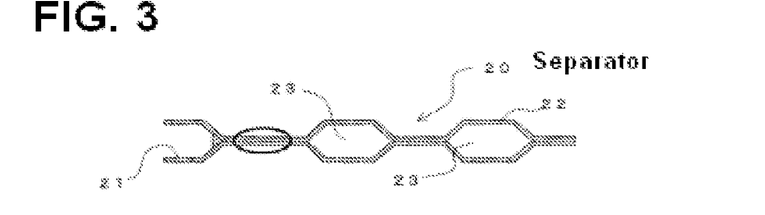
FIG. 3 is a schematic diagram showing the structure of a separator for a fuel cell as another example of components that are joined or bonded by a joining method according to the present invention.

FIG. 3 is a cross-sectional view showing the structure of a separator for a fuel cell made of an aluminum alloy that is joined by the joining method described above as another embodiment according to the present invention. In the figure, fuel cell separator 20 is constructed by superimposing two wave or corrugated plates 21, 22 press formed of aluminum alloy plate material (for example, 5000 series, 6000 series) as shown in the figure and by joining the portions of contact as indicated by ellipse mark by the present inventive method to form passages for a fuel gas and oxidizing gas.

When joining, both plate materials 21, 22 are superimposed with placing a tape-like zinc foil insert material of 100

μm thickness on the joint portion, and put under pressure by a jig for fixation, and placed in a high-frequency induction furnace.

Similarly, by heating and holding at 450° C., for example, the two plates 21 and 22 are joined to complete manufacture of fuel cell separator 20. The surface roughness Ra of both plates will be finished such that ratio Ra/t is within a preferred range described above, by finishing to about 0.6 μm (Ra/t=0.006), for example, to have a good bond or joint condition.

In the separator 20 made In this way, a fuel cell stack may be obtained, similarly in the above embodiment, with good sealing property, less distortion, without the risk of gas leaks, and with high accuracy. Further, according to this method, a large number of separators may be housed in a large furnace and many joining portions are joined simultaneously, thus this method presents high efficiency in manufacture compared to TIG welding or laser welding.

Figure 4:
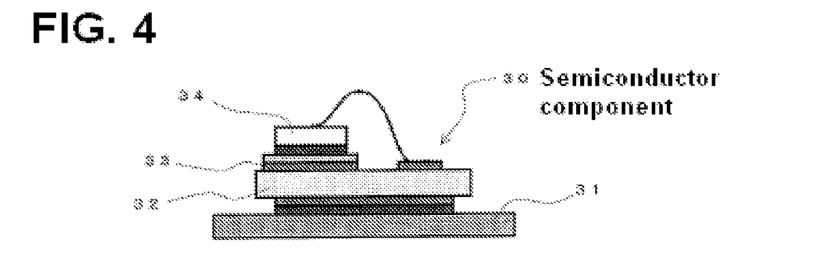
FIG. 4 is a schematic view showing a mounting structure of the semiconductor chip as another example of components that are joined or bonded by a joining method according to the present invention.

FIG. 4 is a schematic cross-sectional view showing a structure of a semiconductor component as still another embodiment, in which a semiconductor chip is joined by the method according to the present invention. Specifically, a semiconductor component 30 shown in the figure is provided with a structure comprising an insulating substrate 32 which is fixed on a heat sink 31, the silicon chip 34 is bonded to a metal wiring 33 disposed on a surface of the substrate 32.

The metal wiring 33 is made of aluminum alloy, and aluminum coating is applied previously on a joint surface of silicon chip 34, and these aluminum-based metals are bonded to each other by the method according to the present invention.

When joining these metal wiring 33 and silicon chip 34, a rapidly quenched ribbon made of Al—Sn—Zn of a thickness of 25 μm is arranged as insert material and the assembly is fixed together under a continuous pressure of 10 MPa by using a jig.

Subsequently, the assembly is stored in this state in a brazing furnace, for example, and is held 220° C. for 1 minute so that the wiring metal 33 and the silicon chip 34 are bonded together.

According to this method, since the joining is complete at low temperature in a short time, minimal thermal effect on the semiconductor chip is assured to prevent performance degradation and distortion of the parts. It should be noted that, in addition to the above-mentioned silicon chip, a semiconductor chip of various things such as SiC or GaN, for example may be used.

Note that, in this case, since the surface roughness Ra of the aluminum coating layer, which is coated on the back side of the silicon chip 34, has a surface roughness Ra of 0.01 μm, and the surface roughness of wiring metal 33 is 0.05 μm, a good joining state is obtained by using the insert material of a thickness of 25 μm (Ra/t=0.002, 0.0004). Further, according to such a method, multiple chips will be able to be bonded at the same time.

Conventionally, the die attach of the semiconductor chip, Sn (tin) based solder has been in use. In this case, in order to improve wettability of the solder, the processes in which the joining electrode containing Ag is deposited by PVD or the like behind chips are common. The Ag film formation leads to cost increase, however. In contrast, in the present invention, the back of the chip is finished with the Al as described above. Thus cost reduction may be achieved because Al is inexpensive and the deposition rate is fast. In addition, Al is not a material subjected to soldering, terminating the back of the tip using Al is not generally done in the semiconductor industry is not generally done.

In the following, description will be made of the present invention in detail with reference to the following examples.

In examples 1-12 and comparative example 1, a butt joint or bond has been conducted between the round bars made of aluminum alloy.

Figure 5A:
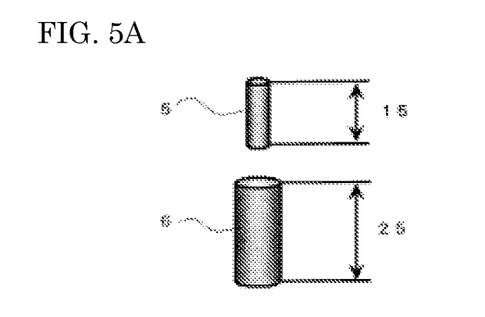
FIGS. 5A and 5B are a schematic diagram illustrating the manner of a round bar butt joint or bond in the embodiment according to the present invention.

As shown in FIG. 5A, a round bar 5 of 15 mm length with 5 mm diameter and another round bar 6 of 25 mm length with 10 mm diameter, each consisting of aluminum alloy A6061 (Al—Mg—S base) were prepared. Here, the joining end face was machined by turning. The bars were finished with a surface roughness of Ra 0.01 μm and that of 2.5 μm respectively. Each surface roughness was confirmed by a stylus instrument of roughness.

As insert materials, a rolled foil of pure zinc (99.99% Zn) of 8 mm diameter (thickness: 25 μm, 100 μm, 300 μm), a Al—Mg—Zn alloy foil of 100 μm thickness (4.1% Al-2.5% Mg-93.4% Zn, melting point: 352° C.), a Ag—Al—Zn alloy (3.28% Ag-4.19% Al-92.53% Zn, melting point: 389° C.), a Al—Cu—Zn alloy foil (4.0% Al-2.0% Cu-94.0% Zn, melting point: 389° C.), a Al—Sn—Zn alloy foil (0.59% Al-91.72% Sn-7.69% Zn, melting point: 204° C.), and a Al—Zn alloy foil (10.8% Al-89.2% Zn, melting point: 385° C.) were prepared respectively. Incidentally, these alloy foils were obtained by spraying molten alloy having the respective components on a roll that rotates at a high speed to form about 20 μm thickness rapidly quench foils and a plurality of such foils were superimposed one on another to have the thickness of 100 μm.

Figure 5B:
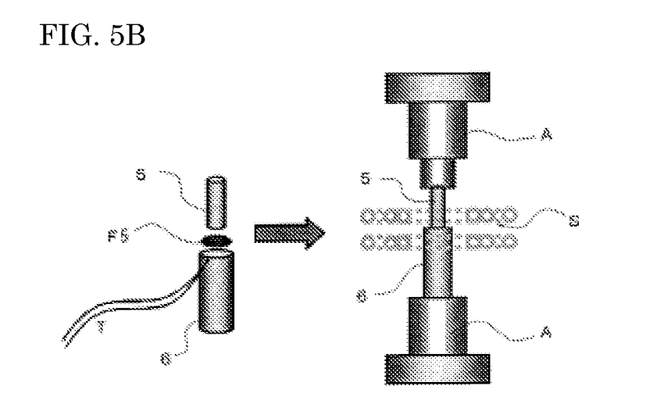

In the state as shown in FIG. 5B, an insert material F5 of the above composition and size is located between end faces of round bars 5, 6, pressurized by Anvil A, A in the atmosphere, and subsequently heated to 400 to 500° C. by a high-frequency heating coil S placed around the site of joining section to hold in the target junction temperature for one minute to thereby obtain the joint structure. Heating rate was 10° C./second. In addition, the junction temperature was measured by R thermocouple T, which was welded to the side surface in the vicinity of the joint end surface of round bar 6. It should be noted that the pressure was set in the rage of 10 to 25 MPa by Anvil A, A while the pressurization started at room temperature and unloaded after completion of joint or joining.

Joint strength of butt joint thus obtained was evaluated by tensile test available with a universal testing machine. Test speed at this time was 1 mm/minute. The results are shown in Table 1 together with joint conditions.

In examples 13 to 19 and comparative example 2, overlap joints of the sheet materials made of an aluminum alloy described above were carried out.

Figure 6A:
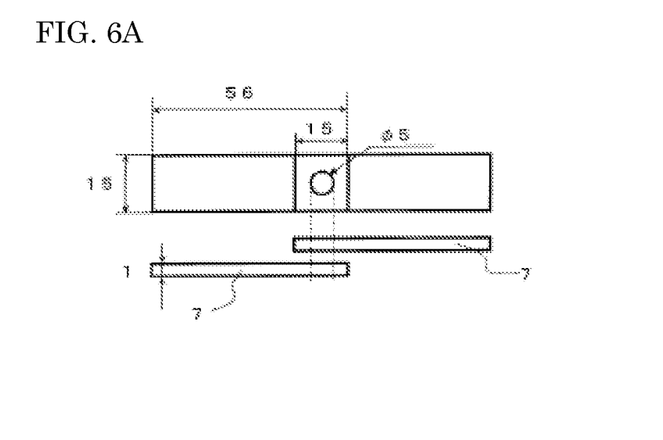
FIGS. 6A and 6B are a schematic diagram showing the manner of the sheet materials overlapped joints or bonds in the embodiment according to the present invention.

As shown in FIG. 6A, plate members 7 of 56 mm length, 15 mm width, and 1 mm thickness made of aluminum alloy similar to that used in the butt joint were used and the ends of the two plate members 7, 7 were overlapped by 15 mm for joining. At this time, regarding the surface roughness Ra of the joint surface, a plurality of plates was finished with 0.01 μm, 0.1 μm and 0.6 μm, respectively. In the same manner as described above, the surface roughness was confirmed by a stylus instrument.

The insert materials were prepared such that a rolled foil (thickness of 25 μm, 100 μm) of 5 mm diameter made of pure zinc (99.99% Zn) and a rapidly quenched ribbon made of Al—Mg—Zn alloy (200 μm thickness) were provided in the similar manner described in Examples 1 to 12. In addition, such insert materials were prepared in which 1 mm thickness plate sheets of 6000 series Al were plated by Zn (plating thickness 10 μm) and by Mg—Zn (plating thickness: 20 μm, 3.0% Mg-97.0% Zn 0, melting point: 364° C.), respectively.

Figure 6B:
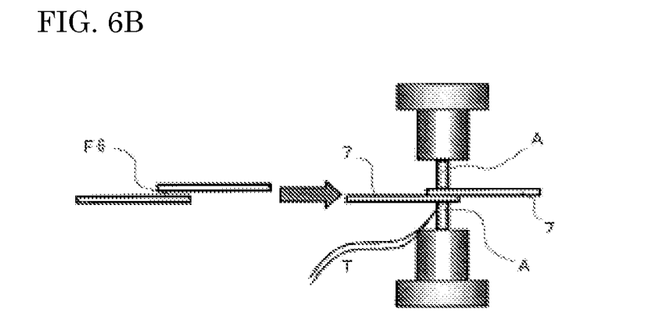

As shown in FIG. 6B, the insert material of above composition and size is located between both sheet materials 7, 7 and both sheets 7, 7 are overlap bonded by energization to heat in the range of 450° C. to 500° C. under pressure of Anvil A, A in the atmosphere. In this overlap joining, such Anvil was used with flat end face of 5 mm diameter with a rate of temperature rise due to heat generated by resistance being 5° C./second. The other joining conditions and methods are essentially the same as those used in the above described but joint.

Joint strength of lap joints obtained was evaluated by tensile shear test available with a universal testing machine. The test speed was 2 mm/min, and the distance between chucks was set 53 mm. The results are shown in Table 1 along with joint conditions.

TABLE 1

| Category | | Joined members | | Insert material | | | Joint conditions | | | Joint strength (MPa) |
|---|---|---|---|---|---|---|---|---|---|---|
| | | SHAPE | Surface Roughness Ra (μm) | Type | Thickness (μm) | Ra/t | Pressure (MPa) | Temp (° C.) | Time (min) | |
| BUTT JOINING | Ex. 1 | ROUND BAR | 0.01 | Zn foil | 100 | 0.0001 | 25 | 400 | 1 | 47.9 |
| | Ex. 2 | | 0.01 | Zn foil | 100 | 0.0001 | 20 | 450 | 1 | 57.2 |
| | Ex. 3 | | 0.01 | Zn foil | 100 | 0.0001 | 15 | 500 | 1 | 49.4 |
| | Ex. 4 | | 0.01 | Zn foil | 300 | 0.00003 | 10 | 500 | 1 | 10.8 |
| | Ex. 5 | | 0.01 | Zn foil | 25 | 0.0004 | 10 | 500 | 1 | 20.8 |
| | Ex. 6 | | 0.01 | Al—Mg—Zn f. | 100 | 0.0001 | 25 | 400 | 1 | 88.7 |
| | Ex. 7 | | 0.01 | Al—Mg—Zn f. | 100 | 0.0001 | 25 | 500 | 1 | 32.2 |
| | Ex. 8 | | 2.5 | Al—Mg—Zn f. | 100 | 0.025 | 25 | 400 | 1 | 80.5 |
| | Ex. 9 | | 0.01 | Ag—Al—Zn f. | 100 | 0.0001 | 25 | 440 | 1 | 86.4 |
| | Ex. 10 | | 0.01 | Ag—Cu—Zn f. | 100 | 0.0001 | 25 | 400 | 1 | 88.0 |
| | Ex. 11 | | 0.01 | Al—Sn—Zn f. | 100 | 0.0001 | 25 | 350 | 1 | 14.2 |
| | Ex. 12 | | 0.01 | Al—Zn foil | 100 | 0.0001 | 25 | 420 | 1 | 52.3 |
| | Comp. Ex. 1 | | 0.01 | None | — | — | 10 | 500 | 1 | 1.9 |
| OVERLAP JOINING | Ex. 13 | SHEET METAL | 0.6 | Zn foil | 100 | 0.006 | 5 | 500 | 1 | 22.6 |
| | Ex. 14 | | 0.6 | Zn foil | 100 | 0.006 | 10 | 500 | 1 | 47.2 |
| | Ex. 15 | | 0.6 | Zn foil | 25 | 0.024 | 5 | 500 | 1 | 16.4 |
| | Ex. 16 | | 0.1 | Zn foil | 100 | 0.001 | 20 | 450 | 1 | 62.8 |
| | Ex. 17 | | 0.6 | Al—Mg—Zn f. | 200 | 0.003 | 25 | 400 | 1 | 68.3 |
| | Ex. 18 | | 0.6 | Zn plating | 10 | 0.060 | 15 | 500 | 1 | 21.3 |
| | Ex. 19 | | 0.6 | Mg—Zn plating | 20 | 0.030 | 10 | 400 | 1 | 41.2 |
| | Comp. Ex 2 | | 0.6 | None | — | — | 10 | 500 | 1 | 0 |

In Comparative Examples 1 and 2 in Table 1 where joining without using insert material was conducted, the joint was not substantially accomplished. In contrast, in the Examples in which an insert material mainly composed of Zn is interposed between both materials and caused a eutectic reaction to occur with base material Al, sound joint was confirmed to be realized. In addition, as far as the scope of the embodiments described, if joint temperature is high with low pressure, or if the thickness of insert material is excessive relative to surface roughness of joint surface, a decreasing trend of joint strength has been noted.

The invention claimed is:

1. A method for joining two aluminum-based metals, comprising:
    interposing, between the two aluminum-based metals so as to be in direct contact with the two aluminum-based metals, an insert material consisting of zinc, magnesium and aluminum,
        wherein zinc presents a main constituent element being at least 90%,
        wherein the insert material covers no less than 30% of an area to be joined of the two aluminum-based metals, and
        wherein the insert material has an insert-material eutectic temperature of 330° C.;
    heating the two aluminum-based metals to a temperature that causes a eutectic reaction while pressing the two aluminum-based metals toward each other, thereby generating a melt by eutectic reaction containing aluminum from the two aluminum-based metals at a joint interface,
        the temperature being between the insert-material eutectic temperature and 400° C.,
        the pressing being performed within a range of 5 MPa to 30 MPa;
    subsequently pressurizing the two aluminum-based metals against each other to discharge aluminum oxide film along with the melt from the joint interface; and
    sealing with the discharged aluminum oxide film and the melt around a joined area of the two aluminum-based metals, wherein the two aluminum-based metals are overlap joined, spot joined, or seam joined.

2. The joining method as claimed in claim 1, wherein the insert material is foil shaped.

3. The joining method as claimed in claim 1, wherein the insert material is coated on at least one joint surface by plating or powder deposition.

4. A part joined by the method of claim 1, wherein the two aluminum-based metals are joined directly or via a mixture containing a component derived from the insert material.

5. The part as claimed in claim 4, further comprising a joint portion in which the two aluminum-based metals are joined together directly or via the mixture containing a component derived from the insert material.

6. The part as claimed in claim 4, wherein zinc is diffused in a joint surface of the two aluminum-based metals.

7. The joining method as claimed in claim 1, wherein a ratio of surface roughness of each respective surface of the two aluminum-based metals facing the insert material to a thickness of the insert material is within a range between 0.00003 to 0.06.

8. A method for joining two aluminum-based metals, comprising:
  interposing, between the two aluminum-based metals so as to be in direct contact with the two aluminum-based metals, an insert material consisting of zinc, magnesium and aluminum,
    wherein zinc presents a main constituent element being at least 90%,
    wherein the insert material covers no less than 30% of an area to be joined of the two aluminum-based metals, and
    wherein the insert material has an insert-material eutectic temperature of 330° C.;
  heating the two aluminum-based metals to a temperature that causes a eutectic reaction while pressing the two aluminum-based metals toward each other, thereby generating a melt by eutectic reaction containing aluminum from the two aluminum-based metals at a joint interface,
  the temperature being at about 400° C.,
  the pressing being performed within a range of 5 MPa to 30 MPa;
  subsequently pressurizing the two aluminum-based metals against each other to discharge aluminum oxide film along with the melt from the joint interface; and
  sealing with the discharged aluminum oxide film and the melt around a joined area of the two aluminum-based metals, wherein the two aluminum-based metals are overlap joined, spot joined, or seam joined.

9. The method of claim 1, wherein a concentration of the magnesium is 2.5%.

10. The method of claim 8, wherein a concentration of the magnesium is 2.5%.

11. The method of claim 1, wherein a rate of surface roughness of the aluminum based metals to a thickness of the insert material is less than 0.003.

12. The method of claim 8, wherein a rate of surface roughness of the aluminum based metals to a thickness of the insert material is less than 0.003.

* * * * *